United States Patent
Xiong

(10) Patent No.: US 11,640,925 B2
(45) Date of Patent: May 2, 2023

(54) SYSTEM AND METHOD FOR A DEVICE PACKAGE

(71) Applicant: Infineon Technologies Americas Corp., El Segundo, CA (US)

(72) Inventor: Shunhe Xiong, Westford, MA (US)

(73) Assignee: INFINEON TECHNOLOGIES AMERICAS CORP., El Segundo, CA (US)

(*) Notice: Subject to any disclaimer, the term of this patent is extended or adjusted under 35 U.S.C. 154(b) by 0 days.

(21) Appl. No.: 17/467,850

(22) Filed: Sep. 7, 2021

(65) Prior Publication Data

US 2021/0407874 A1 Dec. 30, 2021

Related U.S. Application Data

(62) Division of application No. 16/816,823, filed on Mar. 12, 2020, now Pat. No. 11,121,048.

(51) Int. Cl.
| | |
|---|---|
| *H01L 23/29* | (2006.01) |
| *H01L 23/04* | (2006.01) |
| *H01L 23/00* | (2006.01) |
| *H01L 23/15* | (2006.01) |
| *H01L 23/482* | (2006.01) |

(52) U.S. Cl.
CPC ........... *H01L 23/15* (2013.01); *H01L 23/04* (2013.01); *H01L 23/291* (2013.01); *H01L 23/4824* (2013.01); *H01L 23/562* (2013.01)

(58) Field of Classification Search
CPC ....... H01L 23/15; H01L 23/04; H01L 23/291; H01L 23/4824; H01L 23/562
See application file for complete search history.

(56) References Cited

U.S. PATENT DOCUMENTS

| | | |
|---|---|---|
| 5,006,922 A | 4/1991 | McShane et al. |
| 5,731,227 A | 3/1998 | Thomas |
| 9,559,026 B2 | 1/2017 | Xiong et al. |
| 9,887,143 B2 | 2/2018 | Partington et al. |
| 2008/0029906 A1* | 2/2008 | Otremba ............ H01L 23/3121 257/E21.705 |
| 2011/0177292 A1 | 7/2011 | Teshima et al. |
| 2017/0236819 A1 | 8/2017 | Kanai et al. |
| 2018/0233421 A1 | 8/2018 | Bayerer |
| 2019/0287943 A1* | 9/2019 | Wang ..................... H01L 24/41 |

OTHER PUBLICATIONS

Xiong, Shunhe et al., "The Sup/R-SMD, A New IR HiRel Surface Mount Device Package", Application Note AN-1222, IOR HiRel, An Infineon Technologies Company, Dec. 20, 2017, 13 pages.

* cited by examiner

*Primary Examiner* — Peniel M Gumedzoe

(74) *Attorney, Agent, or Firm* — Slater Matsil, LLP

(57) ABSTRACT

A packaged power device includes a ceramic package body having a top drain pad having a first area, a top source pad having a second area smaller than the first area, and a top gate pad having a third area smaller than the second area; a power device having a bottom surface affixed to a top drain pad, a die source pad coupled to the top source pad, and a die gate pad coupled to the top gate pad; and a ceramic lid affixed to the ceramic package body to form the packaged power device.

19 Claims, 16 Drawing Sheets

SYSTEM AND METHOD FOR A DEVICE PACKAGE

This application is a divisional of U.S. patent application Ser. No. 16/816,823, filed on Mar. 12, 2020, which application is hereby incorporated herein by reference.

TECHNICAL FIELD

The present invention relates generally to a system and method for a device package.

BACKGROUND

Surface mount device (SMD) packages can be used to house semiconductor devices and directly connect them to printed circuit boards (PCBs). A large number of electronic circuit designs use SMD packages due to various benefits that the surface mount devices can offer. For example, in military and space applications (e.g., high performance vehicles, aircraft, space shuttles and satellites) where high reliability is imperative, SMD packages can provide the robustness necessary in extreme or harsh environments, while offering benefits such as smaller size, lighter weight, and excellent thermal performance.

However, the popularity of the SMD packages has been somewhat hindered by the coefficient of thermal expansion (CTE) incompatibility between different materials used in different portions of a case of a SMD package, and between the SMD package and the PCB material. For example, a conventional SMD package may include metal alloy sidewalls and a ceramic base. While the metal alloy and ceramic materials may have substantially matched CTEs at room temperature, their CTEs can diverge drastically as temperature increases. Thermal stress can accumulate between the sidewalls and the base as they both expand and contract during fabrication processes and thermal cycles. In addition, when a conventional SMD package is mounted onto a PCB, a CTE mismatch between the conventional SMD package and the PCB may introduce mounting stress to the SMD package. These stresses can cause fatigue and cracking of the SMD package, which in turn can result in hermeticity loss of the SMD package and damage to the semiconductor devices and circuitry inside the SMD package.

Accordingly, there is a need to overcome such drawbacks and deficiencies by providing a semiconductor package, such as a SMD package, that can substantially reduce fatigue and cracking of the semiconductor package due to thermal and mounting stresses.

SUMMARY

A package comprises a ceramic package body comprising an interior cavity portion and an exterior portion; a top drain pad having a first area, a top source pad having a second area different from the first area, and a top gate pad having a third area different from the second area, wherein the top drain pad, the top source pad, and the top gate pad are disposed on a bottom surface of the interior cavity portion, and wherein the top drain pad, the top source pad, and the top gate pad are isolated from one another by ceramic material of the ceramic package body; and a bottom drain pad having a fourth area, a bottom source pad having a fifth area different from the fourth area, and a bottom gate pad having a sixth area different from the fifth area, and wherein the bottom drain pad, the bottom source pad, wherein the bottom drain pad, the bottom source pad, and the bottom gate pad are disposed on a major surface of the exterior portion, and wherein the bottom gate pad are isolated from one another by the ceramic material of the ceramic package body, and wherein the top drain pad and the bottom drain pad are coupled together through at least one drain pad via, the top source pad and the bottom source pad are coupled together through at least one source pad via, and the top gate pad and the bottom gate pad are coupled together through at least one gate pad via.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
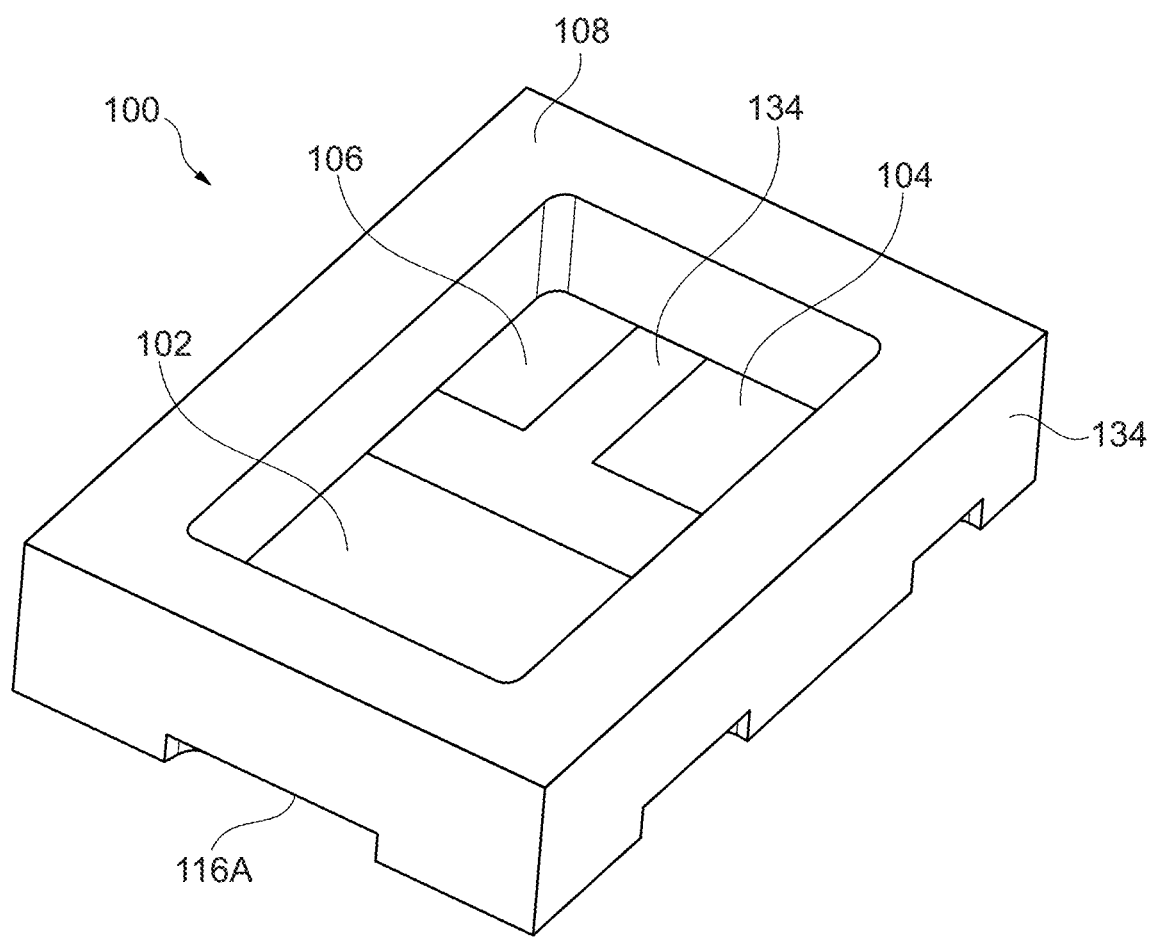
FIG. 1 shows a top perspective view of a ceramic package body, according to an embodiment.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a surface mount packaged used for power devices such as a power transistor or a power diode. Embodiments of the present invention can also be applied to other packages types and/or packages configured to house a wide variety of electronic components.

According to embodiments, a power package includes a number of advantageous aspects occurring at the same time, including small assembled package size, large power handling capability, hermetic seal between the ceramic package body and the ceramic lid, high reliability, and surface mount capability. A small size of the power package is advantageously attained because semiconductor technology is constantly improving and power devices are becoming smaller; in embodiments the power package advantageously accommodates this trend. In some embodiments, the power package also accommodates large power dissipation because power devices are capable of switching more power than previous designs due to further improvements in semiconductor technology. In embodiments, a power package with a hermetic sealed enclosure is advantageously provided for many military and space applications, so that moisture or other environmental factors will not degrade the packaged power device. In embodiments, high reliability is advantageously provided to withstand various harsh operating environments. When mounted on a substrate such as PCB, for example, the power package advantageously survives numerous temperature cycles ranging from extreme high temperatures to extreme low temperatures. The power package, according to embodiments, advantageously maintains its integrity and the solder joint affixing the power package to the PCB will still be intact. The solder joint is also easily visible in embodiments so that the integrity of the solder joint can be readily determined. Finally, in some embodiments the power package is surface mountable directly on a PCB or other such substrates using a common surface mount process that is compatible with other surface mount devices on the same PCB. Various embodiments of a power package capable of providing all of the simultaneous advantages are described in further detail below.

In embodiments, the power package comprises an aluminum nitride (AlN) ceramic package body. Aluminum nitride is selected due to its high thermal conductivity of up to 285 watts per meter-Kelvin (W/m*K), and because aluminum nitride is an electrical insulator. In embodiments, the power package comprises an aluminum nitride ceramic lid so CTE mismatch is minimized. In embodiments, the lid comprises preform solder and it is solder sealed onto the ceramic package body. Different ceramic materials other than aluminum nitride ceramic can be used for the ceramic package body and the lid. For example, alumina (also known as "aluminum oxide") can be used instead of aluminum nitride. The thermal conductivity properties of the power package will be changed depending upon the ceramic material used. To minimize stresses in the power package, the same ceramic material is used for both the ceramic package body and the ceramic lid.

In embodiments, the pad layout for the ceramic package body includes different drain, source, and gate pads. In embodiments, the drain pad comprises a top drain pad, a top source pad, and a top gate pad. The top pads are associated with the bottom surface of an interior cavity portion of the ceramic package body, with the top drain pad designed to receive a two or three terminal power semiconductor device. In embodiments, the top drain pad has a first area larger than a second area of the top source pad. The second area of the top source pad, in turn, is larger than a third area of the top gate pad. The asymmetric layout of the top pads is used for maximum layout efficiency such that a minimum package area is attained. In embodiments, the drain pad also comprises a bottom drain pad, a bottom source pad, and a bottom gate pad. The bottom pads are associated with an exterior portion of the ceramic package body. The bottom pads also have a similar asymmetric layout roughly corresponding to the asymmetric layout of the top pads. The bottom pads are designed to be soldered to a PCB using a castellation pattern described below. In embodiments the top and bottom pads can be formed of gold or aluminum, or other conductive materials or their alloys. Vias are used to electrically couple the top and bottom pads together, wherein a larger pad such as the drain pad may include as many as twelve or more vias, whereas a smaller pad such as the gate pad may include only three or more vias. The via material can be tungsten, copper, or other conductive materials, or their alloys, in embodiments.

According to embodiments, the power package thus attains an advantageously small size having a footprint 0.220 inch by 0.150 inch, and a height of 0.060 inch. The dimensions of the power package can be changed as desired to any suitable dimensions. The power package is designed to accommodate a semiconductor device or die comprising a three terminal or two terminal semiconductor device such as a Metal-Oxide Semiconductor Field-Effect Transistor (MOSFET), diode, having a die attach area smaller than the top drain pad area. In an embodiment, the die attach area (top drain pad dimensions) is about 0.095 inch by 0.085 inch. The dimensions of the die attach area can be changed as desired to any suitable dimensions. In embodiments, the die source pad and the die gate pad are coupled to the top source pad and the top gate pad of the ceramic package body using gold bond wires, or other suitable conductive wires. Multiple bond wires can be used for coupling the die source pad to the top source pad so that package resistance is minimized.

In embodiments, the ceramic package body comprises a castellation pattern formed by one or more notches or recesses in each of the bottom drain, source, and gate pads, but also in the corresponding sidewalls of the exterior of the ceramic package body. The notches are metallized and comprise the same material as the corresponding bottom drain, source, or gate pad. The metallized notches facilitate solder adherence and thus form solder fillets to increase the strength of solder joints. The castellation pattern can comprise several different patterns, as will be shown and described in further detail below. In embodiments, the castellation pattern will make a corresponding solder joint easily visible in a side view of the power package, and the integrity of the solder joint easy to ascertain in an inspection. The castellation pattern also enables a direct mount of the power package on a PCB. The power package can be directly mounted on a PCB with a common Surface Mount Technology (SMT) process, and no additional leads or carrier is needed. The power package, according to embodiments, is compatible with most common PCB materials such as glass-reinforced epoxy laminate materials and polyimide, as well as other common PCB materials.

Other features and advantages of embodiments of the power package are shown and described in further detail below.

FIG. 1 shows a top perspective view of a ceramic package body 100, according to an embodiment. Ceramic package body 100 comprises a top drain pad 102, a top source pad 104, and a top gate pad 106. The top pads are in an example asymmetric layout, with the top drain pad 102 having a first area larger than a second area of the top source pad 104, and with the top source pad 104 having the second area larger than a third area of the top gate pad 106. The top pads are electrically isolated by the ceramic material 134 of the ceramic package body 100. Ceramic package body 100 also includes interior sidewalls and exterior sidewalls, as well as a metallized top surface 108. In an embodiment, metallized top surface 108 comprises a layered metal structure including a layer of tungsten, a layer of nickel, and a layer of gold. Other metallization structures can also be used. Ceramic package body 100 also includes a castellation pattern including a plurality of notches 116A that are best seen and described with respect to subsequent drawing figures.

Figure 2:
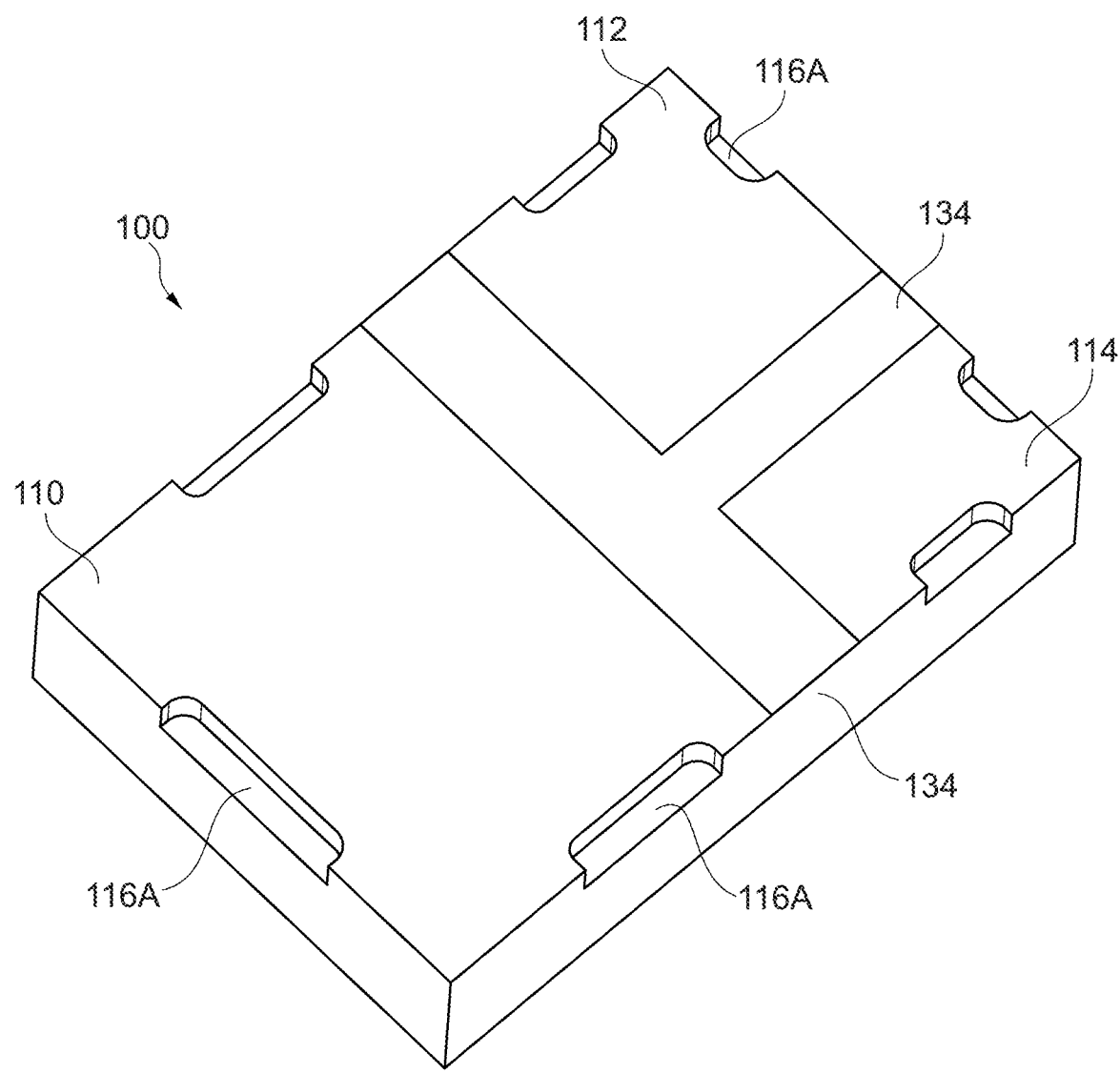
FIG. 2 shows a bottom perspective view of the ceramic package body of FIG. 1.

FIG. 2 shows a bottom perspective view of the ceramic package body 100 of FIG. 1. Ceramic package body 100 comprises a bottom drain pad 110, a bottom source pad 112, and a bottom gate pad 114. The bottom pads are also electrically isolated by the ceramic material 134 of the ceramic package body 100. The bottom pads also have an example asymmetric layout and are roughly in the same lateral location as the top pads shown in FIG. 1. The bottom drain no has a fourth area larger than a fifth area of the bottom source pad 112, and the bottom source pad 112 has a fifth area larger than a sixth area of the bottom gate pad 114. While the top and bottom pads are generally in the same lateral area, the individual areas of the corresponding top and bottom pads may not be the same, as the top pads are limited by the sidewalls of the ceramic package body 100. The bottom pads are not limited by the sidewalls of the ceramic package body 100 and can extend to the edges of the bottom surface of the ceramic package body 100. The ceramic package body also includes a castellation pattern established by a plurality of metallized notches or recesses 116A, whose purpose is to receive solder and establish a visible solder joint between the bottom surface of a bottom pad and a surface of a PCB (not shown in FIG. 2). For example, bottom drain pad no includes three notches 116A, bottom source pad includes two notches 116A, and bottom gate pad also includes two notches 116A. The notches 116A remove material from the bottom pads, as well as the exterior sidewalls of ceramic package body 100. The notches 116A are metallized with the same metal used for the bottom pads. When the package is soldered on a PCB with a surface mount process, the solder will fill the notches and form solder fillets to strengthen the solder joints.

The castellation pattern shown in FIG. 2 is well suited for attaching the ceramic package body 100 to the surface of a PCB, but is only one example of many such castellation patterns. Additional castellation patterns are shown in subsequent drawings and described in further detail below.

Figure 3:
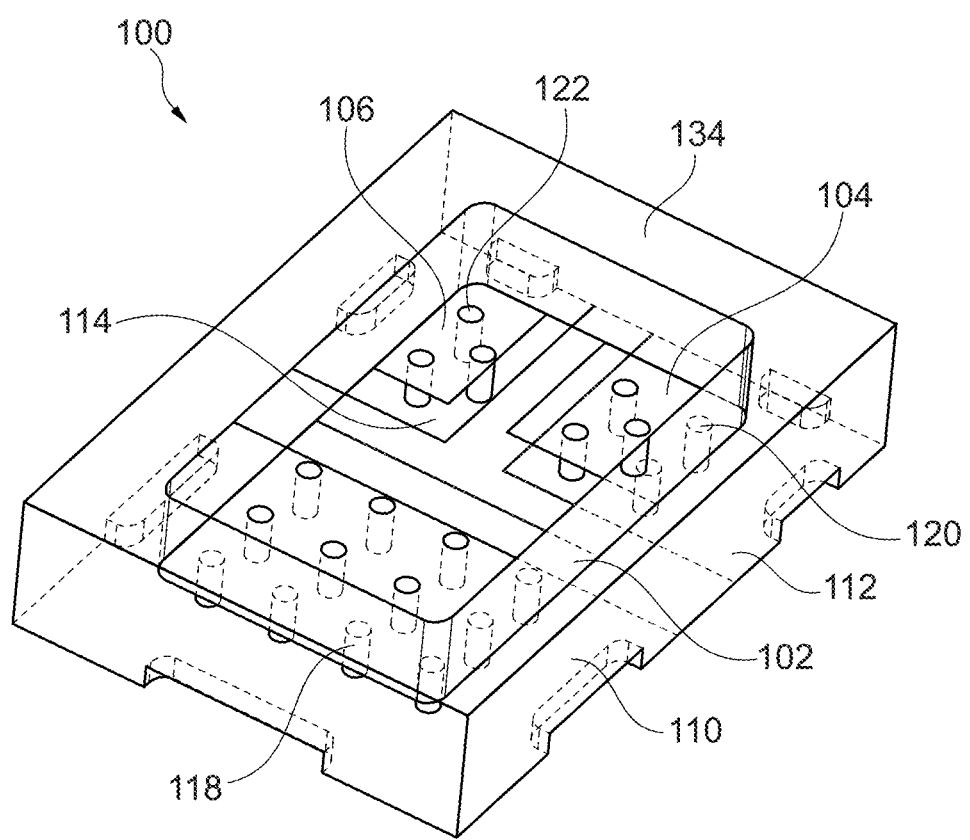
FIG. 3 shows a top perspective view of the ceramic package body of FIG. 1 showing further interior details, such as vias between top pads and bottom pads.

FIG. 3 shows a top perspective view of the ceramic package body 100 of FIG. 1 showing further interior details, such as a plurality of vias located between top pads and bottom pads. For example, a plurality of vias 118 are used to electrically connect top drain pad 102 to bottom drain pad 110. The plurality of vias 118 extend through the ceramic material 134 of a bottom portion of ceramic package body 100. While twelve such vias 118 are shown, it will be understood by those skilled in the art that additional or fewer vias can be used to electrically connect the top drain pad 102 to the bottom drain pad 110. While the vias are shown as cylindrical structures, other shaped structures can also be used. In addition, even a solid structure can be used to couple the top drain pad 102 to the bottom drain pad 110. A plurality of vias 120 are used to electrically connect top source pad 104 to bottom source pad 112. While five such vias are shown, any suitable number may be used. A plurality of vias 122 are used to electrically connect top gate pad 106 to bottom gate pad 114. While three such vias are shown, any suitable number may be used.

Figure 4:
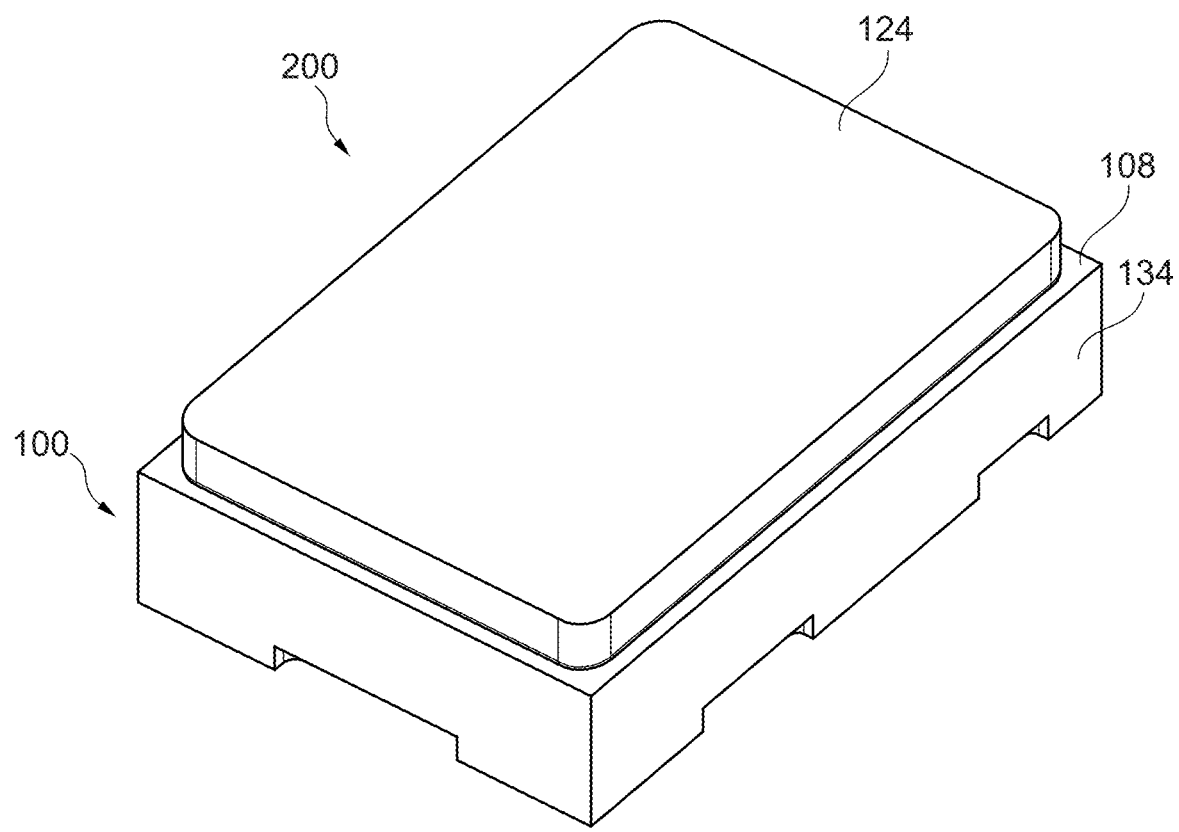
FIG. 4 shows a top perspective view of an assembled package including the ceramic package body of FIG. 1, and a lid affixed to the ceramic package body.

FIG. 4 shows a top perspective view of an assembled package 200 including the ceramic package body 100 of FIG. 1, and a lid 124 affixed to the ceramic package body 100. The bottom surface of lid 124 (not shown in FIG. 4) includes a similar metallized surface as the metallized top surface 108 of ceramic package body 100. The metallized surface of lid 124 can comprise a layered structure including tungsten, nickel, and gold layers. In addition, the metallized surface of lid 124 can include a solder preform so that the lid 124 can be affixed to the metallized top surface 108 of ceramic package body 100. The lid 124 is placed on ceramic package body 100 and heated to a temperature sufficient to melt the solder preform and establish a hermetic seal therebetween.

Figure 5:
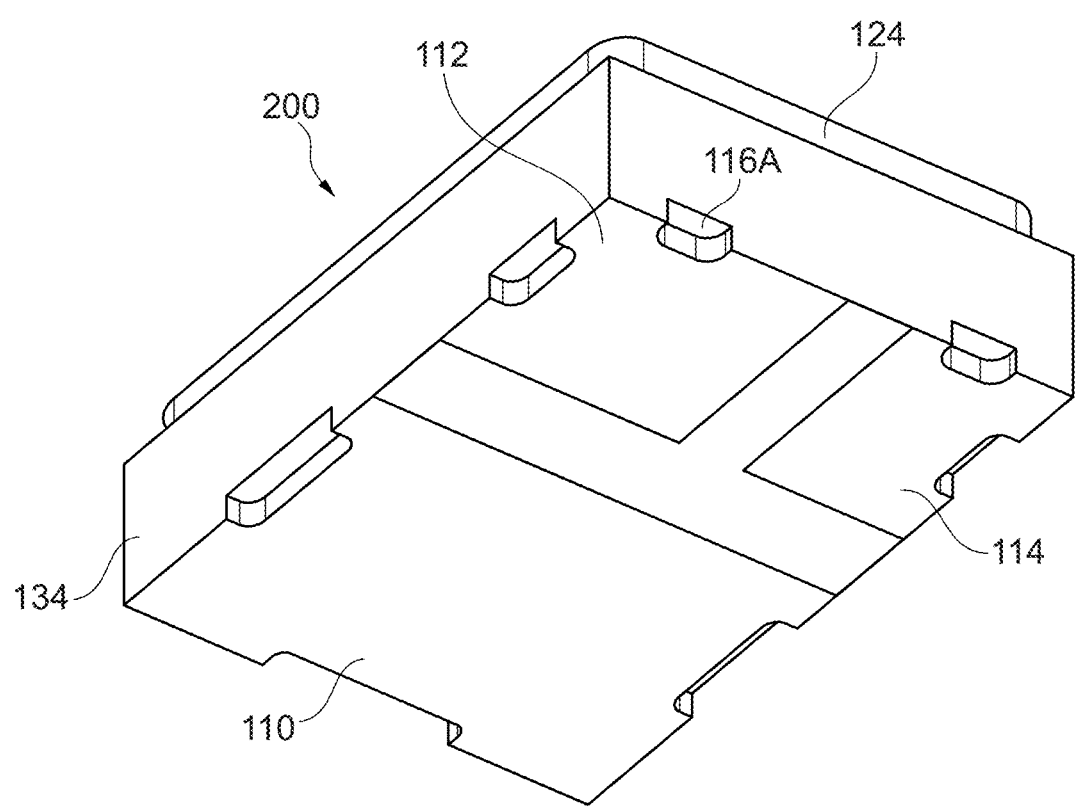
FIG. 5 shows a bottom perspective view of the assembled package of FIG. 4.

FIG. 5 shows a bottom perspective view of the assembled package 200 of FIG. 4, showing further details of the bottom drain pad 110, the bottom source pad 112, and the bottom gate pad 114, and the electrical isolation provided by the ceramic material 134. The castellation pattern formed by notches 116A, and the attached lid 124 are also shown in FIG. 5.

Figure 6A:
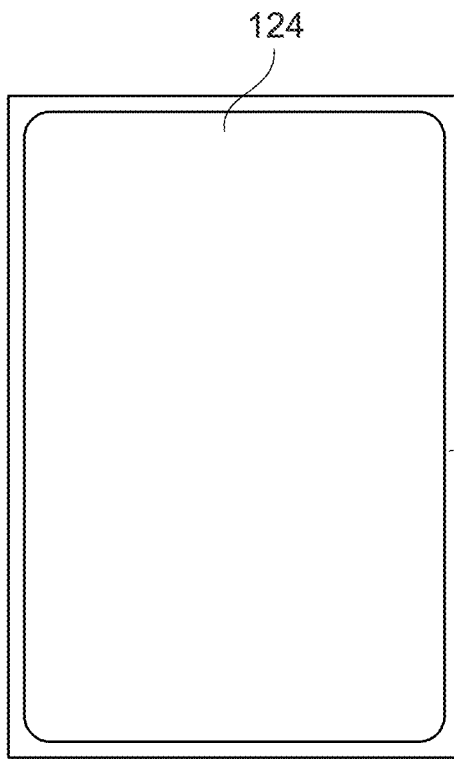
FIGS. 6A, 6B, 6C, 6D, and 6E show various additional views of the assembled package of FIG. 4.
Figure 6B:
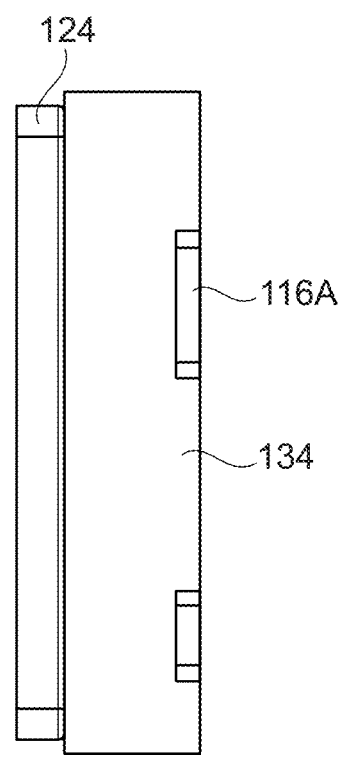
Figure 6C:
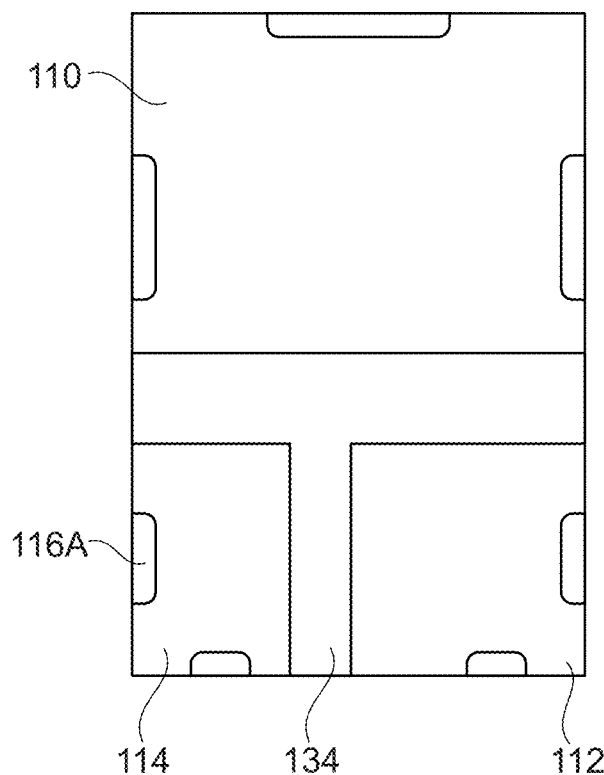
Figure 6D:
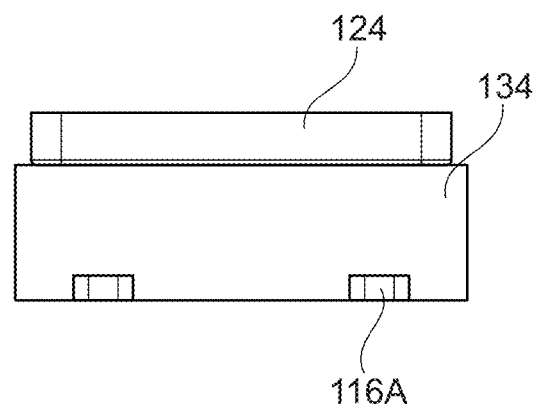

FIGS. 6A, 6B, 6C, 6D, and 6E show various additional views of the assembled package 200 of FIG. 4. For example, FIG. 6A shows a top plan view of assembled package 200 of FIG. 4, wherein the upper surface of the lid 124 and the metalized top surface 108 of the ceramic package body 100 are shown. FIG. 6B shows a first side view of assembled package 200 of FIG. 4, wherein the lid 124, the ceramic material 134 of the ceramic package body, and notches 116A are shown. FIG. 6C shows a bottom plan view of assembled package 200 of FIG. 4, wherein the bottom drain pad 110, the bottom source pad 112, and the bottom gate pad 114, electrically isolated from each other by the ceramic material 134 of the ceramic package body are shown. Notches 116A for forming a castellation pattern are also shown in FIG. 6C. FIG. 6D shows a second side view of assembled package 200 of FIG. 4, wherein the lid 124, the ceramic material 134 of the ceramic package body, and notches 116A are shown.

Figure 6E:
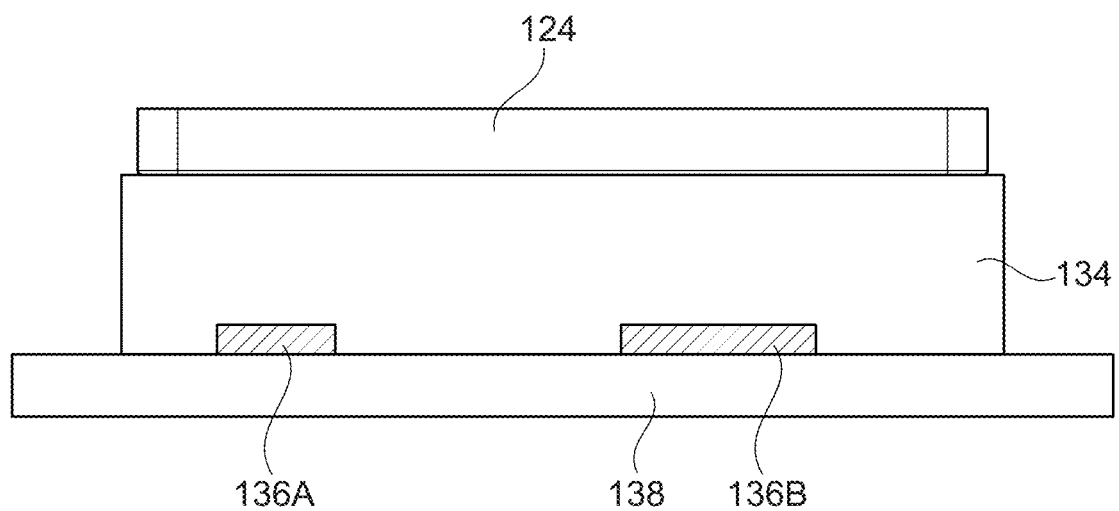

FIG. 6E shows the first side view of the assembled package 200 of FIG. 4, wherein the lid 124, the ceramic material 134 of the ceramic package body, and visible solder joints 136A and 136B are shown. Visible solder joints 136A and 136B fill in notches 116A previously shown in FIG. 6B. Note that solder joints 136A and 136B securely affix assembled package 200 to the upper surface of a substrate 138 such as a PCB or other such substrate.

Figure 7A:
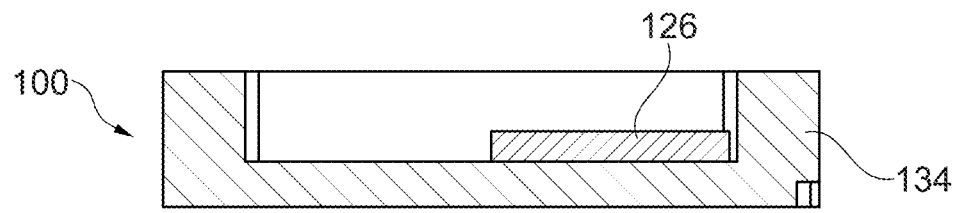
FIG. 7A shows a cross-sectional side view of a ceramic package body including a semiconductor device, according to an embodiment.

FIG. 7A shows a side view of a ceramic package body 100 including a semiconductor device or die 126, which comprises a power transistor or power diode according to an embodiment. In other embodiments semiconductor device or die 126 can comprise an integrated circuit including additional components. The semiconductor device or die 126 is attached (soldered) to the top drain pad, which is not visible in the side view of FIG. 7A. The cross-sectional view of FIG. 7A, however, shows the location of the semiconductor device 126 with respect to the ceramic material 134 of the ceramic package body 100.

Figure 7B:
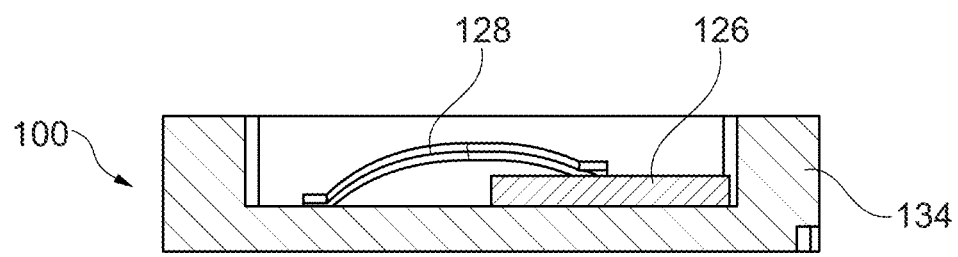
FIG. 7B shows a cross-sectional side view of the ceramic package body of FIG. 7A further including bonding wires attached to the semiconductor device and the package.

FIG. 7B shows a side view of the ceramic package body of FIG. 7A further including bonding wires 128 attached to the semiconductor device 126. The bonding wires are used to electrically coupling bonding pads on the semiconductor device 126 to bonding pads in the ceramic package body 100. Neither the semiconductor device bonding pads nor the ceramic package bonding pads are visible in the cross-sectional side view of FIG. 7B, but are best seen in the top plan view of FIG. 8, which is described below.

Figure 7C:
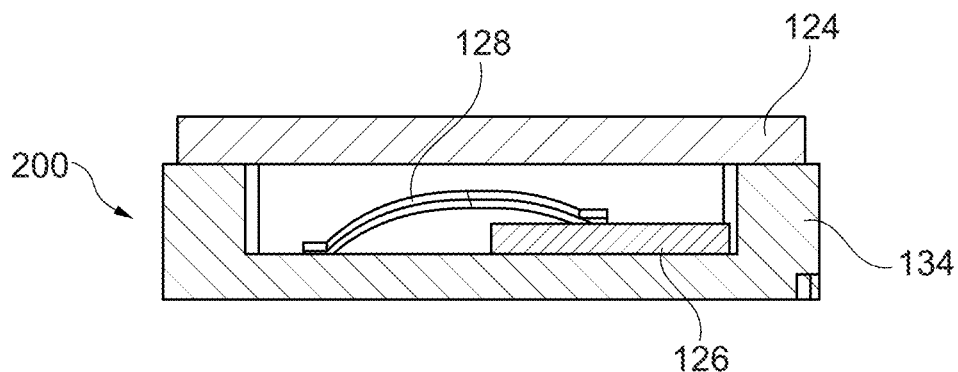
FIG. 7C shows a cross-sectional side view of the ceramic package body of FIG. 7B further including a lid affixed to the ceramic package body to form an assembled package.

FIG. 7C shows a side view of the ceramic package body 100 of FIG. 7B further including a lid 124 affixed to the ceramic package body 100 to form an assembled package 200. The lid 124 is affixed to the ceramic package body 100 using a solder preform as previously described.

Figure 8:
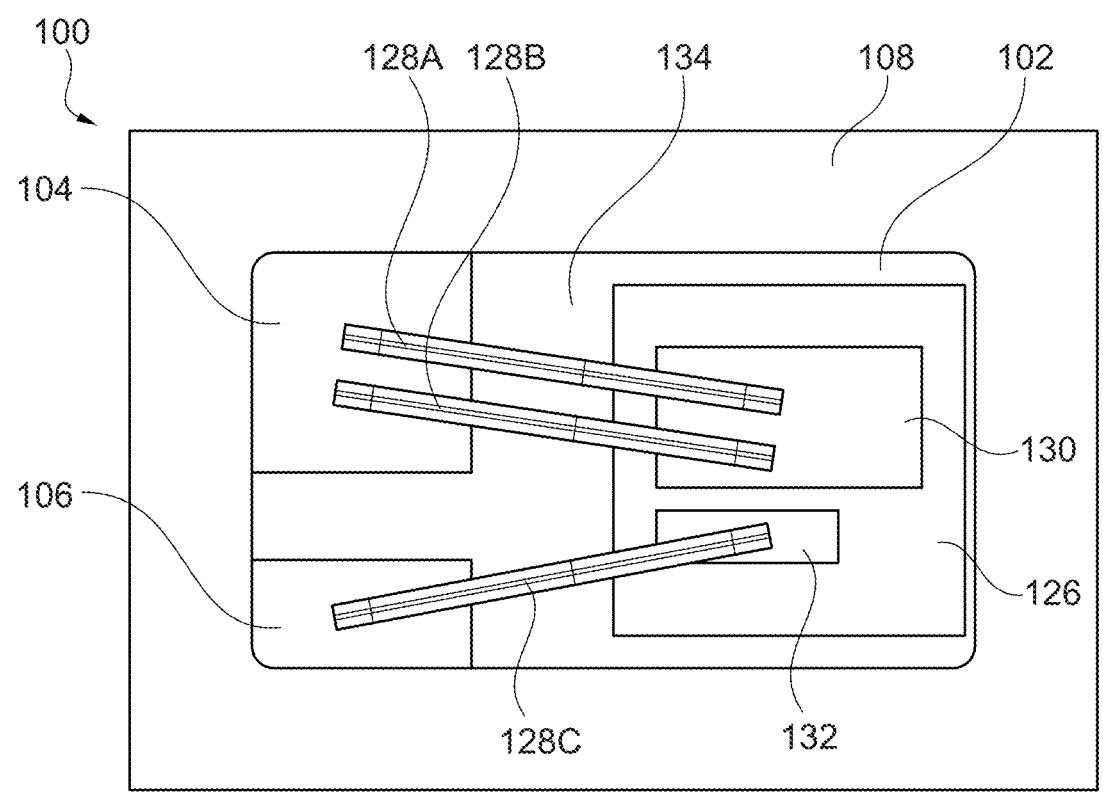
FIG. 8 shows a top plan view of the ceramic package body and integrated circuit of FIG. 7B.

FIG. 8 shows a plan view of the ceramic package body 100 and semiconductor device 126 of FIG. 7B, including metallized top surface 108, top drain pad 102, top source pad 104, and top gate pad 106. Semiconductor device or die 126 is affixed to top drain pad 102, and, in an embodiment comprises a power transistor. The drain of the power transistor is electrically connected (soldered) to the top drain pad 102, the die source pad 130 of the power transistor is electrically connected to the top source pad 104 through a first set of bond wires 128A and a second set of bond wires 128B, and the die gate pad 132 of the power transistor is electrically connected to the top gate pad 106 through a third set of bond wires 128C. The top drain pad 102, the top source pad 104, and the top gate pad 106 are electrically isolated from one another through the ceramic material 134 of the ceramic package body 100 as previously described. While two sets of bond wires are shown to connect the die source pad 130 to the top source pad 104, any number of bond wires can be used. While only one set of bond wires is shown to connect the die gate pad 132 to the top gate pad 106, any number of bond wires can be used. Typically more bond wires are used for the source connections as compared to the gate connections due to the high currents associated with the source. The die pad layout and number of bond wires will change for a two-terminal power device such as a power diode, which will be appreciated by those skilled in the art.

Figure 9:
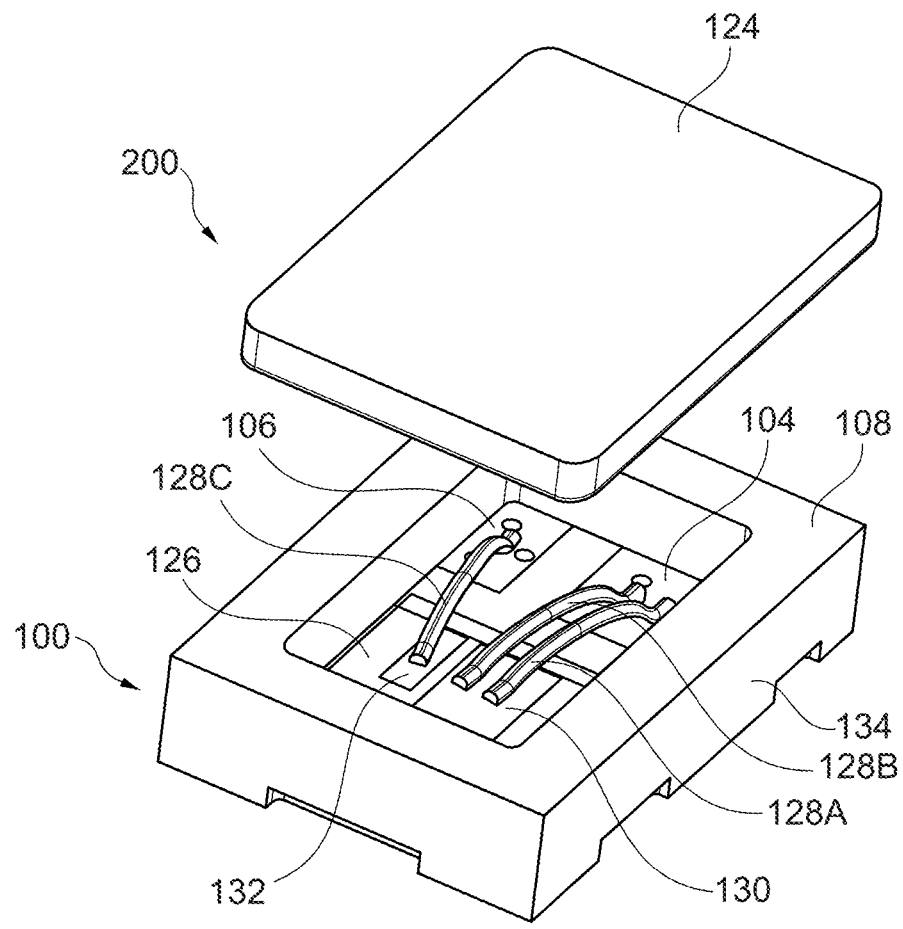
FIG. 9 shows an exploded top perspective view of the assembled package and semiconductor device of FIG. 7C.

FIG. 9 shows an exploded top perspective view of the assembled package 200 and semiconductor device 126 of FIG. 7C. FIG. 9 thus shows the ceramic lid 124 and ceramic package body 100. Ceramic package body 100 is shown to include the metallized top surface 108 and ceramic material 134, previously described. The die source pad 130 and top source pad 104 are coupled together through bond wire sets 128A and 128B, as well as die gate pad 132 and top gate pad 106 are coupled together through bond wire set 128C, previously described.

Figure 10:
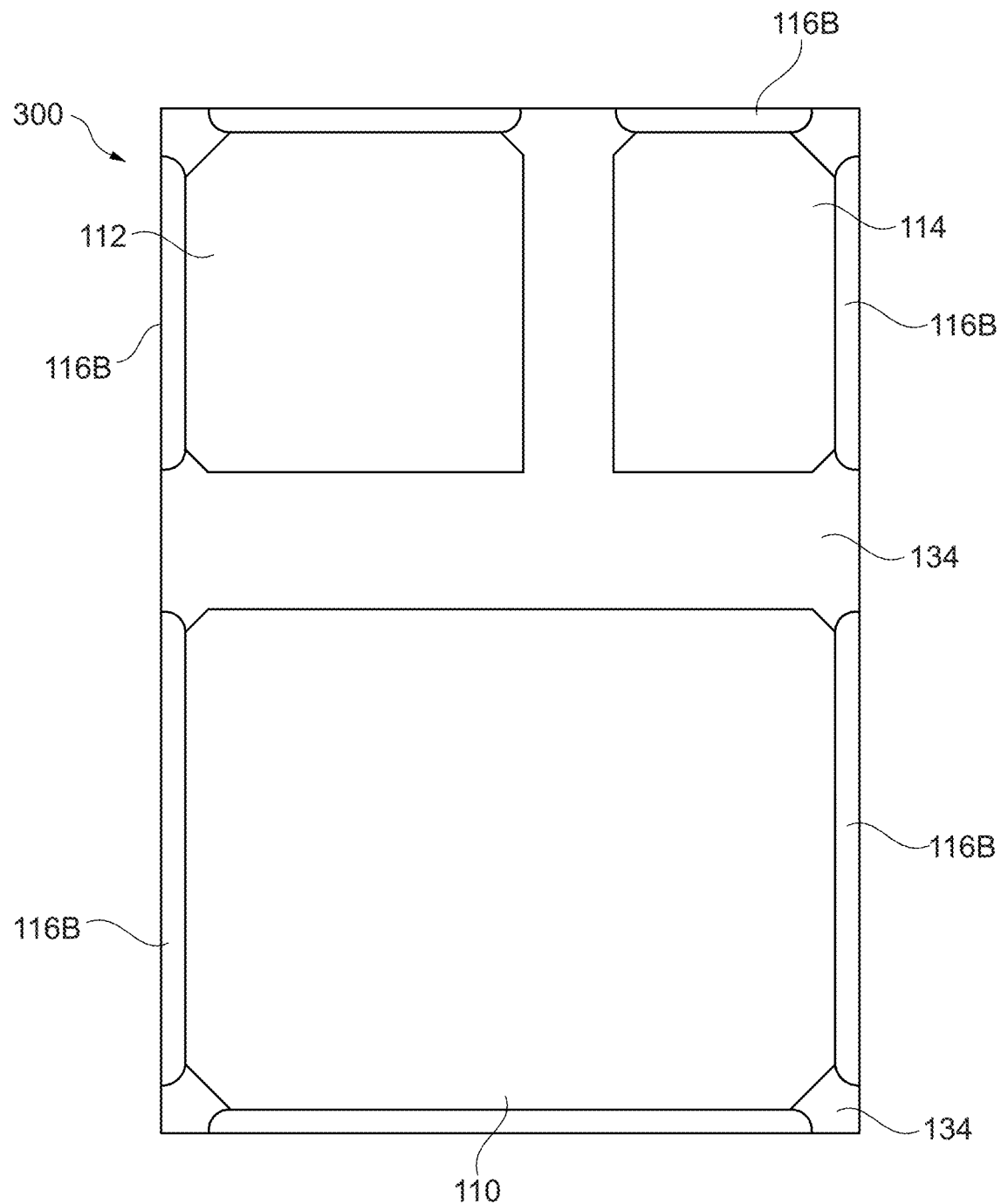
FIG. 10 shows a bottom plan view of a ceramic package body having an alternative castellation pattern, according to an embodiment.

FIG. 10 shows a bottom plan view of a ceramic package body 300 having an alternative castellation pattern formed using notches 116B, according to an embodiment. Bottom drain pad 110, bottom source pad 112, and bottom gate pad 114, as well as ceramic material 134 are also shown. While notches 116B are similar in location and shape to notches 116A shown in, for example, FIGS. 2 and 6B, the notches are longer in length than notches 116A. The longer notch length may convey an advantage in that additional solder can be used to attach package body 300 to the top surface of a PCB with a stronger solder joint.

Figure 11:
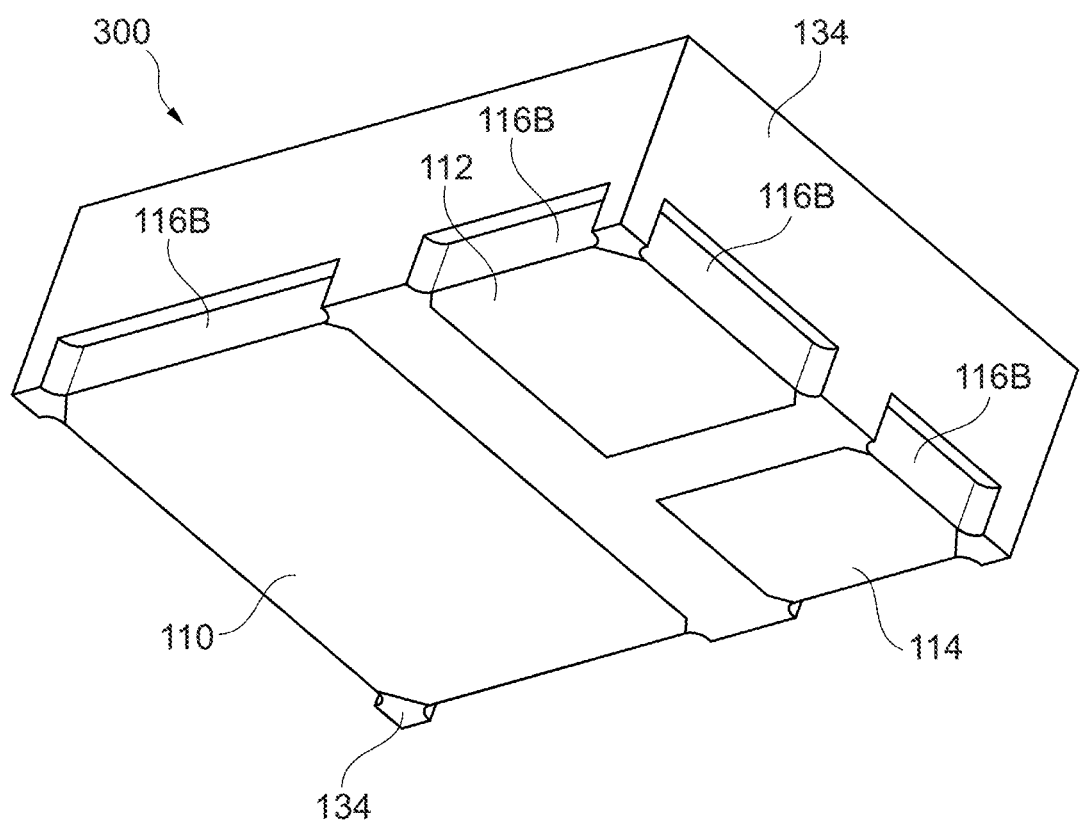
FIG. 11 shows a bottom perspective view of the ceramic package body of FIG. 10.

FIG. 11 shows a bottom perspective view of the ceramic package body of FIG. 10 showing additional views of bottom drain pad 110, bottom source pad 112, bottom gate pad 114, ceramic material 134, and notches 116B.

Figure 12:
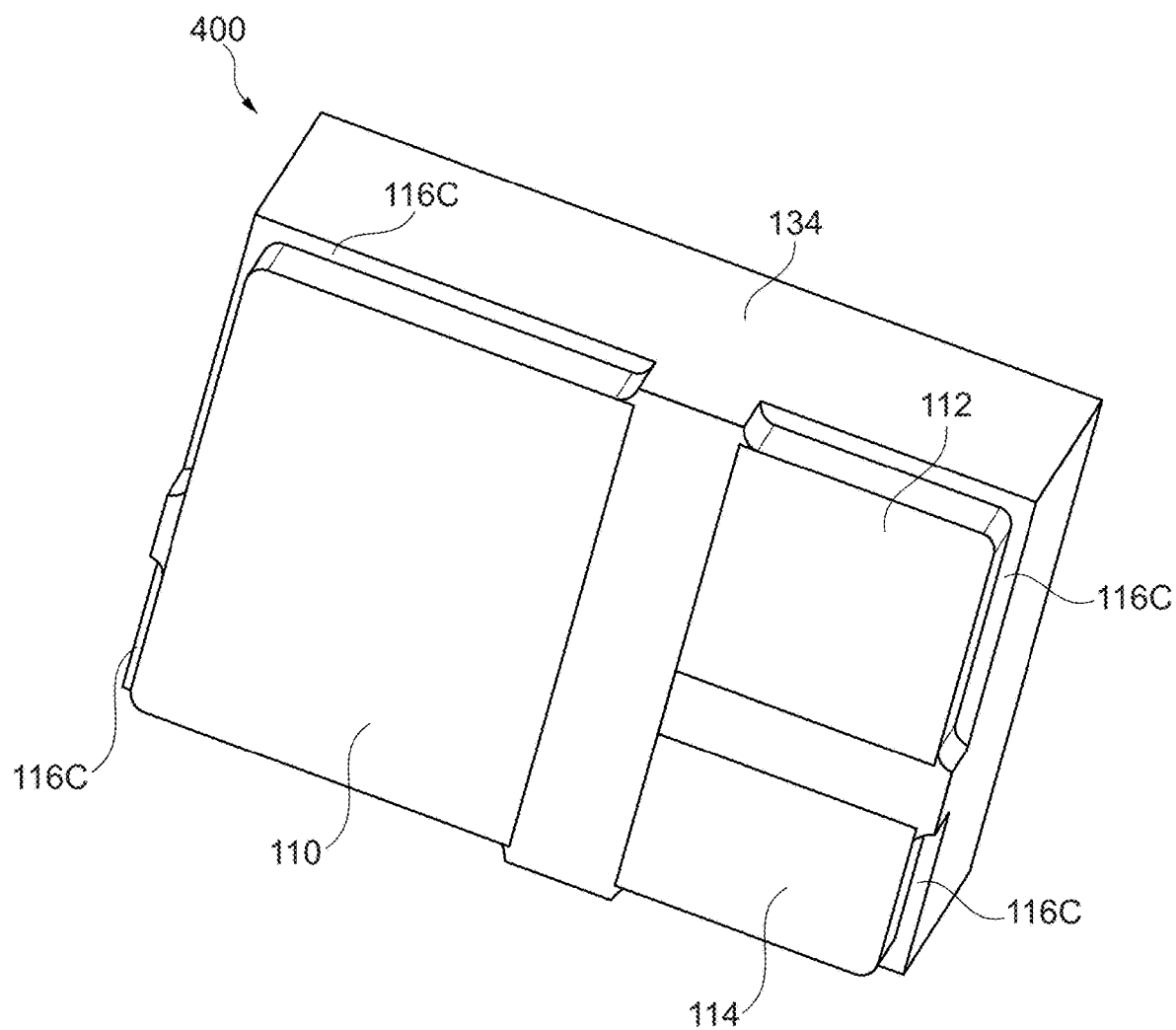
FIG. 12 shows a bottom perspective view of a ceramic package body having another alternative castellation pattern, according to an embodiment.

FIG. 12 shows a bottom perspective view of a ceramic package body 400 having another alternative castellation pattern, according to an embodiment, formed by L-shaped notches 116C. Bottom drain pad 110 includes two L-shaped notches 116C, bottom source pad 112 includes a single L-shaped notch 116C, and bottom gate pad 114 includes a single L-shaped notch 116C. The bottom pads are electrically isolated from each other with the ceramic material 134 as previously described.

Figure 13A:
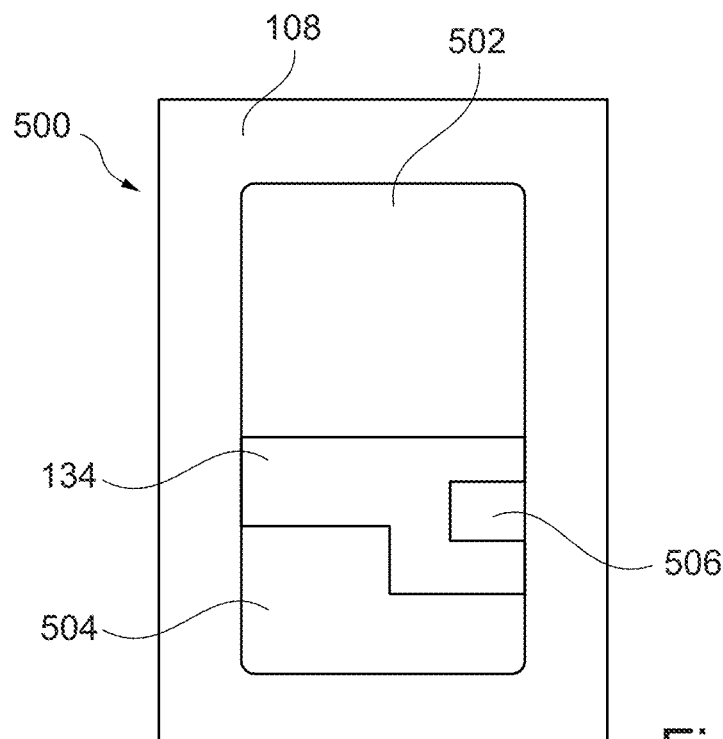
FIG. 13A shows a top plan view of a ceramic package body including an alternative top pad layout, according to an embodiment.

FIG. 13A shows a top plan view of a ceramic package body 500 including an alternative top pad asymmetric layout, according to an embodiment. While the metallized top surface 108 is the same as previously shown and described, the top pads may be different. For example, top source pad 504 is irregularly shaped and top gate pad 506 is offset from top source pad 504. Top drain pad 502 is similar to top drain pad 102 previously shown and described. The three top pads are electrically isolated from one another with a "Y-shaped" portion of ceramic material 134. The relative sizes of the top pads are as previously described, wherein the top drain pad 502 has the greatest area, top source pad 504 has the second greatest area, and the top gate pad 506 has the smallest area of the three pads.

Figure 13B:
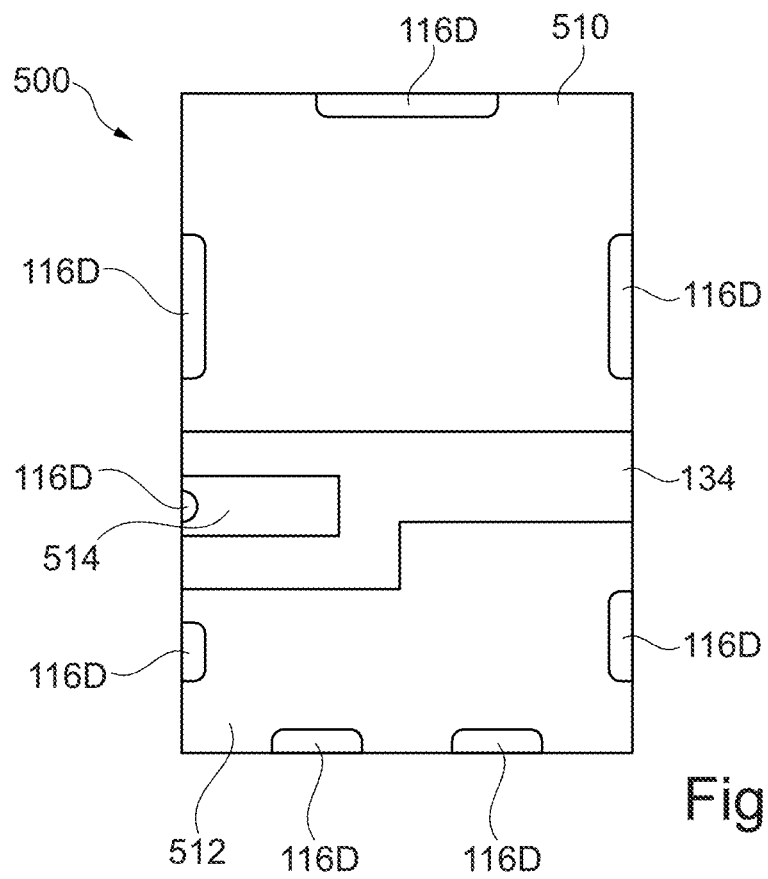
FIG. 13B shows a bottom plan view of the ceramic package of FIG. 13A including an alternative bottom pad layout.

FIG. 13B shows a bottom plan view of the ceramic package body 500 of FIG. 13A also including an alternative bottom pad asymmetric layout. The bottom pad asymmetric layout is similar to the alternative top pad asymmetric layout, and the bottom pads are coupled to the top pads with vias (not shown in FIG. 13A or 13B) as previously described. For example, bottom source pad 512 is irregularly shaped and bottom gate pad 514 is offset from bottom source pad 512. Bottom drain pad 510 is similar to bottom drain pad 110 previously shown and described. The three bottom pads are electrically isolated from one another with a similar "Y-shaped" portion of ceramic material 134. The relative sizes of the top pads are as previously described, wherein the bottom drain pad 510 has the greatest area, bottom source pad 512 has the second greatest area, and the bottom gate pad 514 has the smallest area of the three pads. Ceramic package body 500 also includes a castellation pattern, formed by a plurality of notches 116D as can be seen in FIG. 13B. Bottom drain pad 510 includes three notches 116D, bottom source pad 512 includes four notches 116D, and bottom gate pad 514 includes a single notch 116D. The number of notches 116D can be changed as desired.

While an alternative top and bottom pad layout has been shown in FIG. 13A and FIG. 13B, it will be appreciated by those skilled in the art many other such asymmetric pad layouts are possible. While the top and bottom pad layouts will be similar, they need not be precisely overlapping in a plan view.

Figure 14A:
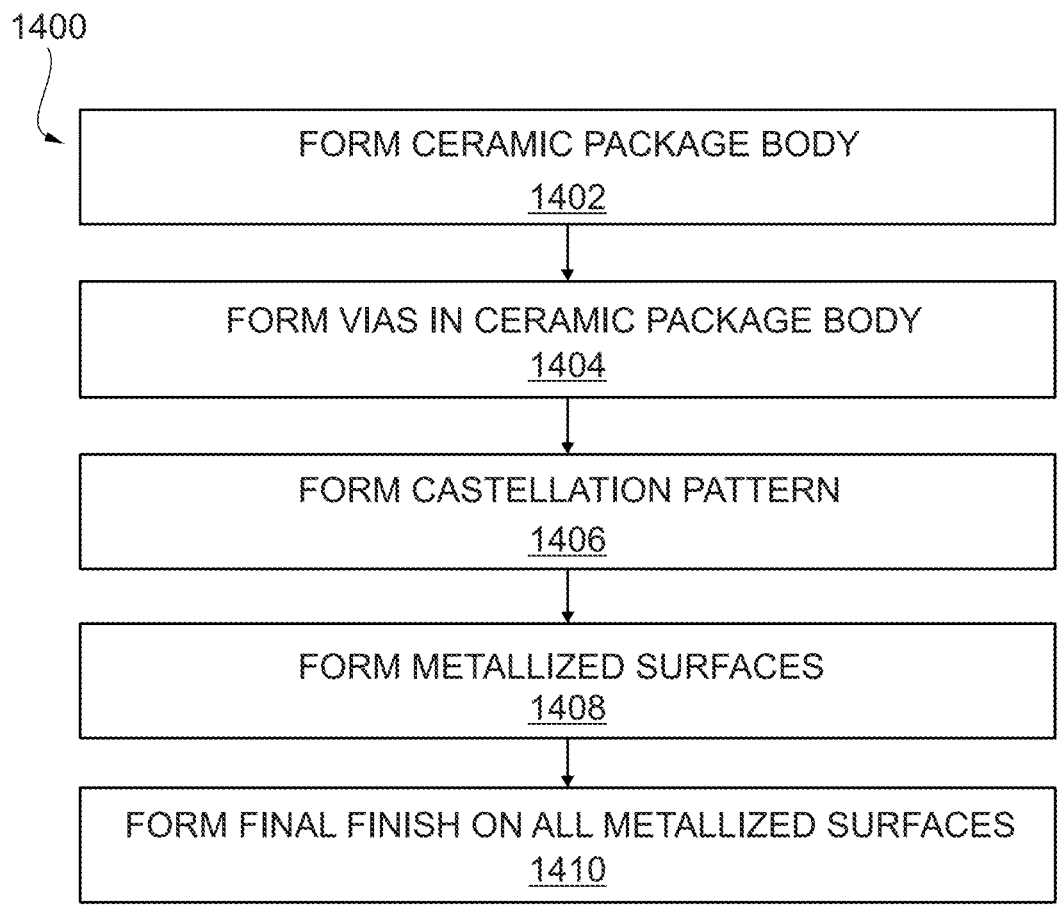
FIG. 14A shows a flow chart for a method of manufacturing a ceramic package body.

FIG. 14A is a flow chart 1400 for manufacturing the ceramic package body. The ceramic package body is manufactured in several steps. First, the ceramic package body is formed from ceramic material such as aluminum nitride, alumina, or other ceramic material at step 1402. The vias are then formed by removing some of the ceramic material from the ceramic package body and filling the removed volume with conductive material such as tungsten or other metals or alloys at step 1404. The castellation pattern is also formed by removing some ceramic material from the ceramic package body at step 1406. At this point in the manufacturing process, the ceramic package body already has the desired shape and size. The metallization process of the ceramic package body is subsequently performed at step 1408, in which a thin layer of metal such as tungsten or other metal is applied to the areas where the top pads, bottom pads, and top metallization surface will be, and also on surfaces around the notches. Finally, at step 1410, corrosion resistant metals such as nickel and gold are applied to all the metallized areas as a final finish to protect the metallization.

Figure 14B:
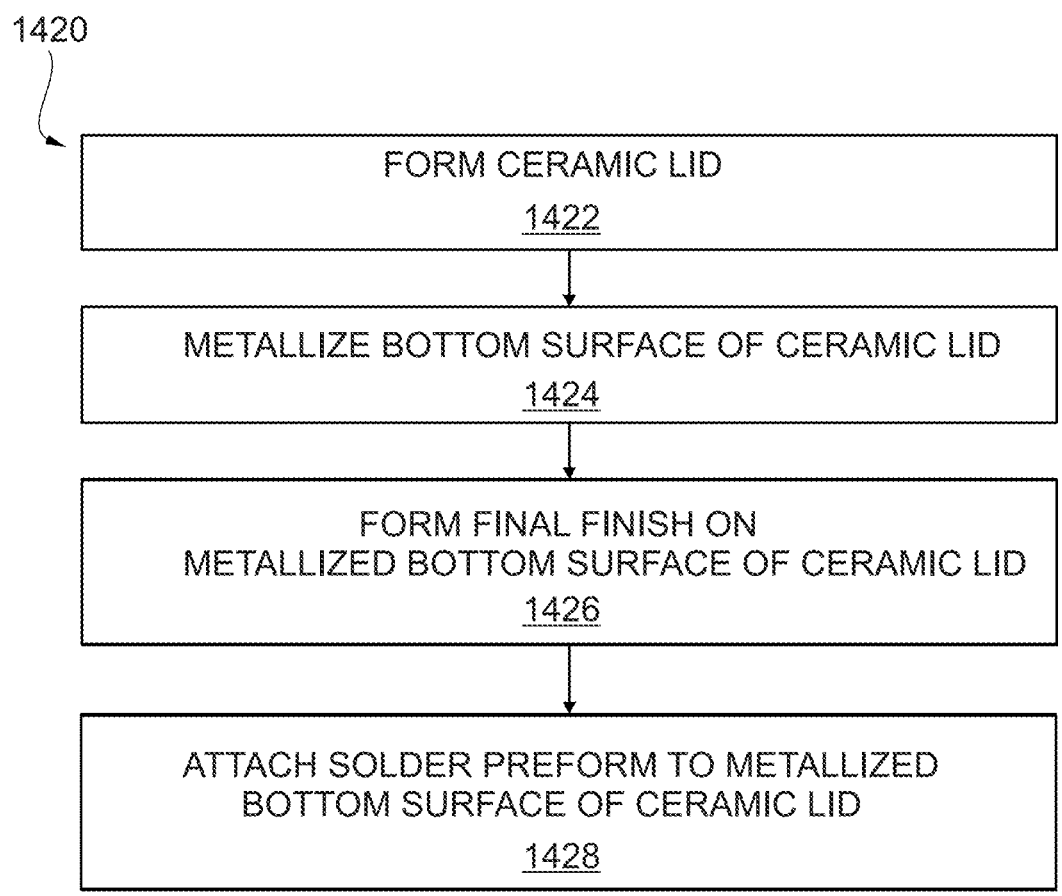
FIG. 14B shows a flow chart for a method of manufacturing a ceramic lid for attaching to the ceramic package body of FIG. 14A.

FIG. 14B is a flow chart 1420 for manufacturing the ceramic lid. The ceramic lid is also manufactured in a few steps. First, the ceramic lid is formed from ceramic material such as aluminum nitride, alumina or other ceramic material at step 1422. Then, at step 1424, the bottom surface of the ceramic lid is metallized with tungsten or other metal or alloy. Next, at step 1426, corrosion resistant metals such as nickel and gold are applied to the metallized areas as a final finish to protect the metallization. Finally, at step 1428, a solder preform (a thin sheet of metal or alloy, usually Au80Sn20) is attached to the metallized bottom surface of the ceramic lid, wherein Au80Sn20 is known in the art as a gold tin eutectic solder with 80% gold and 20% tin by weight.

Example embodiments of the present invention are summarized here. Other embodiments can also be understood from the entirety of the specification and the claims filed herein.

Example 1. According to an embodiment, a package comprises a ceramic package body comprising an interior cavity portion and an exterior portion; a top drain pad having a first area, a top source pad having a second area different from the first area, and a top gate pad having a third area different from the second area, wherein the top drain pad, the top source pad, and the top gate pad are disposed on a bottom surface of the interior cavity portion, and wherein the top drain pad, the top source pad, and the top gate pad are isolated from one another by ceramic material of the ceramic package body; and a bottom drain pad having a fourth area, a bottom source pad having a fifth area different from the fourth area, and a bottom gate pad having a sixth area different from the fifth area, and wherein the bottom drain pad, the bottom source pad, wherein the bottom drain pad, the bottom source pad, and the bottom gate pad are disposed on a major surface of the exterior portion, and wherein the bottom gate pad are isolated from one another by the ceramic material of the ceramic package body, wherein the top drain pad and the bottom drain pad are coupled together through at least one drain pad via, the top source pad and the bottom source pad are coupled together through at least one source pad via, and the top gate pad and the bottom gate pad are coupled together through at least one gate pad via.

Example 2. The package of Example 1, further comprising a ceramic lid affixed to the ceramic package body.

Example 3. The package of any of the previous examples, wherein the ceramic package body and the ceramic lid each comprises aluminum nitride.

Example 4. The package of any of the previous examples, wherein the package has a footprint of about 0.220 inch by 0.150 inch, and a height of about 0.060 inch.

Example 5. The package of any of the previous examples, wherein the ceramic package body comprises a metallized top surface, and the ceramic lid comprises a metallized bottom surface.

Example 6. The package of any of the previous examples, wherein the metallized top surface of the ceramic package body and the metallized bottom surface of the ceramic lid each comprise tungsten, nickel, and gold.

Example 7. The package of any of the previous examples, wherein the exterior portion of the ceramic package body comprises a castellation pattern.

Example 8. The package of any of the previous examples, wherein the castellation pattern comprises a plurality of metallized notches, the metallized notches being configured such that a solder joint affixed to the metallized notch is visible in a side view of the package.

Example 9. The package of any of the previous examples, wherein the castellation pattern comprises three notches in the bottom drain pad, two notches in the bottom source pad, and two notches in the bottom gate pad.

Example 10. The package of any of the previous examples, wherein the castellation pattern comprises two L-shaped notches in the bottom drain pad, a single L-shaped notch in the bottom source pad, and a single L-shaped notch in the bottom gate pad.

Example 11. According to an embodiment, a method of packaging a power device comprises affixing a bottom surface of the power device to a top drain pad of a ceramic package body having a first area; coupling a die source pad of the power device to a top source pad of the ceramic package body having a second area smaller than the first area; and coupling a die gate pad of the power device to a top gate pad of the ceramic package body having a third area smaller than the second area.

Example 12. The method of Example 11 further comprising affixing a ceramic lid to the ceramic package body to form a packaged power device.

Example 13. The method of any of the previous examples, wherein the ceramic package body and the ceramic lid both comprise aluminum nitride.

Example 14. The method of any of the previous examples, further comprising forming a castellation pattern in the ceramic package body.

Example 15. The method of any of the previous examples, further comprising soldering metallized notches in the castellation pattern of the ceramic package body to a substrate, such that solder joints in the metallized notches are visible in a side view of the ceramic package body.

Example 16. According to an embodiment, a packaged power device comprises a ceramic package body having a top drain pad having a first area, a top source pad having a second area smaller than the first area, and a top gate pad having a third area smaller than the second area; a power device having a bottom surface affixed to a top drain pad, a die source pad coupled to the top source pad, and a die gate pad coupled to the top gate pad; and a ceramic lid affixed to the ceramic package body to form the packaged power device.

Example 17. The packaged power device of Example 16, wherein the packaged power device has a footprint of about 0.220 inch by 0.150 inch, and a height of about 0.060 inch.

Example 18. The packaged power device of any of the previous examples, wherein the ceramic package body and the ceramic lid both comprise aluminum nitride.

Example 19. The packaged power device of any of the previous examples, further comprising forming a castellation pattern in the ceramic package body.

Example 20. The packaged power device of any of the previous examples, wherein the castellation pattern comprises metallized notches that are visible in a side view of the ceramic package body.

It is an advantage that a miniature power package according to embodiments exhibits low stress since the ceramic package body and ceramic lid are fabricated from the same ceramic material. The CTE mismatch is therefore minimized and the stress in ceramic is very low. The stress between the ceramic package body and the ceramic lid is low, and the stress within the ceramic package body and within the ceramic lid is also low. Furthermore, no metal base or seal ring is used in some embodiments and so there is essentially no CTE mismatch within the ceramic package body or assembled power package.

It is an advantage that a miniature power package according to embodiments exhibits a low die free package resistance (DFPR). For example, the large source pad described herein allows multiple bond wires and many vias for source connection, so the DFPR is correspondingly low.

It is an advantage that a miniature power package according to embodiments exhibits a low thermal resistance. The ceramic material AlN used in the ceramic package body and the ceramic lid has a low thermal resistance and thus the miniature power package also has a low thermal resistance.

It is an advantage that a miniature power package according to embodiments can be used in harsh environment applications. For example, the power package described herein is functional in harsh environments such as low and high temperature environments, shock and vibration environments, high moisture environments, and high altitude and space environments.

It is an advantage that a miniature power package according to embodiments can accommodate the large power dissipation of power transistors and power diodes, but can be used to package other types of semiconductor devices.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of packaging a power device, the method comprising:
    affixing a bottom surface of the power device to a top drain pad of a ceramic package body having a first area;
    coupling a die source pad of the power device to a top source pad of the ceramic package body having a second area smaller than the first area; and
    coupling a die gate pad of the power device to a top gate pad of the ceramic package body having a third area smaller than the second area,
    wherein the ceramic package body comprises a bottom drain pad coupled to the top drain pad, a bottom source pad coupled to the top source pad, and a bottom gate pad coupled to the top gate pad, wherein the bottom drain pad has a fourth area, wherein the bottom source pad has a fifth area smaller than the fourth area, and wherein the bottom gate pad has a sixth area smaller than the fifth area.

2. The method of claim 1, further comprising affixing a ceramic lid to the ceramic package body to form a packaged power device.

3. The method of claim 2, wherein the ceramic package body and the ceramic lid both comprise aluminum nitride.

4. The method of claim 1, further comprising forming a castellation pattern in the ceramic package body.

5. The method of claim 4, further comprising soldering metallized notches in the castellation pattern of the ceramic package body to a substrate, such that solder joints in the metallized notches are visible in a side view of the ceramic package body.

6. The method of claim 1, wherein the bottom surface of the power device comprises a die drain pad of the power device.

7. A method of forming a package, the method comprising:
    forming a ceramic package body comprising an interior cavity portion and an exterior portion;
    forming a top drain pad having a first area, a top source pad having a second area different from the first area, and a top gate pad having a third area different from the second area, wherein the top drain pad, the top source pad, and the top gate pad are disposed on a bottom surface of the interior cavity portion, and wherein the top drain pad, the top source pad, and the top gate pad are isolated from one another by ceramic material of the ceramic package body; and
    forming a bottom drain pad having a fourth area, a bottom source pad having a fifth area different from the fourth area, and a bottom gate pad having a sixth area different from the fifth area, wherein the bottom drain pad, the bottom source pad, and the bottom gate pad are disposed on a major surface of the exterior portion, and wherein the bottom drain pad, the bottom source pad, and the bottom gate pad are isolated from one another by the ceramic material of the ceramic package body,
    wherein the top drain pad and the bottom drain pad are coupled together through at least one drain pad via, the top source pad and the bottom source pad are coupled together through at least one source pad via, and the top gate pad and the bottom gate pad are coupled together through at least one gate pad via.

8. The method of claim 7, further comprising affixing a ceramic lid to the ceramic package body.

9. The method of claim 8, wherein the ceramic package body and the ceramic lid each comprises aluminum nitride.

10. The method of claim 8, wherein the package has a footprint of about 0.220 inch by 0.150 inch, and a height of about 0.060 inch.

11. The method of claim 8, wherein the ceramic package body comprises a metallized top surface, and the ceramic lid comprises a metallized bottom surface.

12. The method of claim 11, wherein the metallized top surface of the ceramic package body and the metallized bottom surface of the ceramic lid each comprise tungsten, nickel, and gold.

13. The method of claim 8, further comprising forming a castellation pattern in the exterior portion of the ceramic package body.

14. The method of claim 13, further comprising affixing a solder joint to a metallized notch of the castellation pattern, wherein the solder joint is visible in a side view of the package.

15. The method of claim 13, wherein the castellation pattern comprises three notches in the bottom drain pad, two notches in the bottom source pad, and two notches in the bottom gate pad.

16. The method of claim 13, wherein the castellation pattern comprises two L-shaped notches in the bottom drain pad, a single L-shaped notch in the bottom source pad, and a single L-shaped notch in the bottom gate pad.

17. A method of forming a packaged power device, the method comprising:
    forming a ceramic package body having a top drain pad having a first area, a top source pad having a second area smaller than the first area, and a top gate pad having a third area smaller than the second area;
    affixing a bottom surface of a power device to the top drain pad;
    affixing a die source pad of the power device to the top source pad;

affixing a die gate pad of the power device to the top gate pad;

affixing a ceramic lid to the ceramic package body to form the packaged power device; and forming a castellation pattern in the ceramic package body, wherein the castellation pattern comprises metallized notches that are visible in a side view of the ceramic package body.

18. The method of claim 17, wherein the packaged power device has a footprint of about 0.220 inch by 0.150 inch, and a height of about 0.060 inch.

19. The method of claim 17, wherein the ceramic package body and the ceramic lid both comprise aluminum nitride.

\* \* \* \* \*